United States Patent
Fitzi

(10) Patent No.: US 8,179,184 B2
(45) Date of Patent: May 15, 2012

(54) SYSTEM AND METHOD FOR CHARGE INTEGRATION

(75) Inventor: Andreas Fitzi, Stäfa (CH)

(73) Assignee: austriamicrosystems AG, Unterpremsttätten (AT)

( * ) Notice: Subject to any disclaimer, the term of this patent is extended or adjusted under 35 U.S.C. 154(b) by 0 days.

(21) Appl. No.: 12/518,848

(22) PCT Filed: Nov. 28, 2007

(86) PCT No.: PCT/EP2007/062949
§ 371 (c)(1),
(2), (4) Date: Dec. 23, 2009

(87) PCT Pub. No.: WO2008/071548
PCT Pub. Date: Jun. 19, 2008

(65) Prior Publication Data
US 2010/0085103 A1    Apr. 8, 2010

(30) Foreign Application Priority Data
Dec. 11, 2006   (DE) .......................... 10 2006 058 291

(51) Int. Cl.
*H03K 5/00* (2006.01)
(52) U.S. Cl. ................... 327/337; 327/336; 327/509
(58) Field of Classification Search .......... 327/336–337, 327/509–512
See application file for complete search history.

(56) References Cited

U.S. PATENT DOCUMENTS

| 3,619,659 A | 11/1971 | Meyer et al. |
| 5,488,415 A * | 1/1996 | Uno .............................. 348/241 |
| 2009/0309645 A1 * | 12/2009 | Isaacson et al. .............. 327/337 |

FOREIGN PATENT DOCUMENTS
EP    1 011 193    12/1998

OTHER PUBLICATIONS

Z.K. Kalayjian et al., "Mismatch in photodiode and phototransistor arrays", Circuits and Systems, 2000 IEEE International Symposium, vol. 4, No. 28, pp. 121-124, May 2000.
P.E. Allen, "Switched Capacitor Circuits", Van Nostrand Reinhold Company Inc., New York, pp. 596-607, 1984.

* cited by examiner

*Primary Examiner* — Dinh T. Le
(74) *Attorney, Agent, or Firm* — Cozen O'Connor

(57) ABSTRACT

An arrangement for charge integration comprises an input (1) for the provision of a charge-dependent signal and an integrator (30) to integrate a signal present at its input. In addition, a coupling circuit (20) that can adopt at least two operating states is provided to couple the input (1) to the integrator (30) which has a temperature-dependent coupling characteristic. A correction circuit (10) that can be operated by a clock signal is coupled to the input (1) in order to transfer a quantity of charge, and has a temperature characteristic that is derived from the coupling characteristic of the coupling circuit (20).

8 Claims, 2 Drawing Sheets

SYSTEM AND METHOD FOR CHARGE INTEGRATION

RELATED APPLICATIONS

This is a U.S. national stage under 35 USC §371 of application No. PCT/EP2007/062949, filed on Nov. 28, 2007.

This application claims the priority of German Patent Application No. 10 2006 058 291.8 filed Dec. 11, 2006 the entire content of which is hereby incorporated by reference.

FIELD OF THE INVENTION

The invention concerns an arrangement and a method for charge integration and an application of the arrangement.

BACKGROUND OF THE INVENTION

Many sensors in technical applications generate charges that are output as sensor signals. Relatively small currents, for instance, can occur. For this reason it is usual for the charges to be integrated and converted into voltages. The photodiodes used in the sensor field of a digital X-ray machine are an example of this type of sensor.

In order to achieve adequate image quality in digital X-rays, it is desirable for a circuit used for charge integration to exhibit a linear integration function along with low noise. In addition, a circuit of this type should be appropriate for the desired image or frame rates, and should consume low current, in order to avoid a rise in temperature and the associated effects this might have on temperature-dependent components.

Capacitive elements having low capacitances are frequently used for integration in order to reach higher voltages. Switches are also used to control the integration procedure. These often exhibit voltage-dependent parasitic capacitances, arising for instance from the depletion layer capacitance present when semiconductor switches are used. The parasitic capacitances can affect the accuracy of the integration. In addition, the sensor that generates the charge can also exhibit parasitic capacitances, again possibly arising because of the switches used, or in the form of conductor capacitances that can falsify the result of the integration result, depending on the noise in the circuit.

With the aim of improving the precision and the working range of an integration circuit, it is possible, in addition to the charge that is provided by a sensor, to include a further charge in the integration process, where this additional component can be removed computationally from the later integration result. Temperature-dependent variations can, however, occur in the generation of this supplementary charge, and these lead to errors in the integration result.

SUMMARY OF THE INVENTION

An object of the invention is to provide an arrangement and a method of charge integration with which charge integration can be carried out with improved precision and with reduced temperature-dependency. It is also an object of the invention to provide a method for the use of the arrangement.

In one embodiment of the invention, an arrangement for charge integration comprises an input for the supply of a charge-dependent signal and an integrator that is designed to integrate a signal present at its input. In addition, a coupling circuit that can adopt at least two operating states is provided in order to couple the input with the integrator. The coupling circuit here exhibits a temperature-dependent coupling characteristic. The arrangement for charge integration, further comprises a correction circuit that can be operated by a clock signal and is coupled to the input in order to transfer a quantity of charge, and which has a temperature characteristic that is derived from the coupling characteristic of the coupling circuit.

A charge-dependent signal may be supplied to the arrangement, for instance, from a charge-generating sensor such as a photodiode. The charge-dependent signal is forwarded on by the coupling circuit to the integrator in order to create the output signal. It is possible here, for instance, that the transfer characteristic of the coupling circuit changes depending on the operating temperature of the arrangement, so that a higher or lower quantity of charge is transmitted for integration, in comparison, for instance, with a reference temperature.

A quantity of charge can be generated in the correction circuit and forwarded through the coupling circuit for integration in addition to the charge-dependent signal. The quantity of charge can be varied from an initially specified quantity of charge, depending on the temperature in such a way as to compensate for variations that arise as a result of temperature variations in the coupling circuit. This makes it possible for a particular quantity of charge to be integrated in the integrator, independently of temperature, and for this charge to be computed out of the integration results by a subsequent processing unit with little effort.

The correction circuit is, for example, dimensioned such that it comprises a temperature characteristics which serves for a compensation of the temperature-dependent coupling characteristics of the coupling circuit. In other words, the temperature characteristics of the correction circuit is derived from the given temperature characteristics of the coupling circuit.

In one embodiment of the invention, the generation of the quantity of charge, modified in accordance with the temperature, in the correction circuit, can be done in accordance with a switched or clocked process. The correction circuit therefore comprises a clock-dependent characteristics which for instance is given by clock-driven switches. It is for instance possible for the correction circuit to be operated first of all in such a way that a fixed quantity of charge is generated or stored clock-dependent. This quantity of charge can, during a second time period, be modified in a way that depends on temperature, in order, at a later time, to be combined at the input with the charge-dependent signal.

In a further embodiment, the coupling circuit comprises a first and a second transistor. The first transistor can be controlled depending on the charge-dependent signal. The second transistor is configured to transmit the charge-dependent signal in response to a control signal provided from the first transistor. By coupling the integrator with the input through the coupling circuit, the effect of parasitic capacitances that are present, for instance, in a sensor connected to the input, is reduced. This leads to a reduction in non-linearity and to more precise integration.

In a further embodiment of an arrangement for charge integration, the correction circuit comprises a charge store having a switchable coupling to the input, along with a third and a fourth transistor. The charge store can adopt a level of charge that depends on a pre-specified charging voltage, such as by means of a clocked, switchable coupling with the charging power supply connection. The third transistor is controlled depending on the state of charge of the charge store. The fourth transistor is configured to affect the state of charge of the charge store in response to a control signal provided by the third transistor. The first transistor in the coupling circuit and the third transistor in the correction circuit may comprise mutually corresponding temperature characteristics. For instance, the first and the third transistor may, at the same temperature, have the same control characteristics, such as a comparably controlled current in the presence of the same control voltage.

The transistors in the coupling circuit and the correction circuit may, for instance, be implemented as field-effect transistors, e.g. as junction field-effect transistors, JFETs, or as insulated gate field-effect transistors, IGFETs. In other embodiments the transistors may also be implemented as metal oxide-semiconductor field-effect transistors, MOSFETs. When implemented as field-effect transistors, the first and third transistors may, at the same temperature, have the same threshold voltage.

The transistors in the coupling circuit and the transistors in the correction circuit can each be connected in similar circuits. In this way, temperature-dependent effects when switching or controlling the transistors can occur to the same extent when transmitting the signals in the coupling circuit as when modifying the state of charge of the charge store in the correction circuit, and thereby compensate for one another.

In one embodiment, the correction circuit and the coupling circuit each comprise a current source with corresponding temperature characteristics, that is, for instance, a corresponding dependency of the current on the temperature. The current source can, for instance, be used to generate control signals that are used to control the second or fourth transistor.

In a further embodiment, the integrator comprises a differential amplifier with feedback through a capacitative charge store. The additional charge store can here be discharged in response to a further control signal. The capacitative charge store may be implemented, for instance, as a capacitor.

Accordingly, a charge or a charge-dependent signal that is received at the input of the correction circuit can be integrated by means of the capacitative charge store in the integrator to provide a voltage that depends on the quantity of charge that was generated. The discharge can be carried out, for instance, through a switch that is connected in parallel with the capacitative charge store.

In a further embodiment of the invention, the charge-dependent signal can be supplied to the integrator through a switching arrangement that can be operated in response to a further control signal. This can permit the charge-generating circuit, or the coupling circuit, to be connected to the integrator or disconnected from it, in order to control the integration process.

In an embodiment of a method according to the invention for charge integration, a pre-specified quantity of charge is stored, for instance in a capacitative charge store. Depending on the quantity of charge stored, a first control signal is generated. The stored quantity of charge is modified in accordance with the first control signal. The modified quantity of charge provides the basis for generating a first charge-dependent signal. The first charge-dependent signal is added to a second charge-dependent signal that is supplied, depending on which the second control signal is generated. The combined signal is transmitted onwards under the control of the second control signal, and integrated to form an output signal.

The generation of the first and second control signals can be done here in a temperature-dependent manner, so that both the forwarding of the combined signal and the modification of the stored quantity of charge depend to the same extent of the temperature. In this way, temperature effects on the forwarding are compensated for by the effects on the stored quantity of charge. This also results in a more precise and less temperature-dependent integration result.

BRIEF DESCRIPTION OF THE DRAWINGS

The invention is explained in more detail below through several embodiments and with the aid of the figures. Elements with the same function or effect here have the same reference signs.

In the figures.

DETAILED DESCRIPTION OF THE DRAWINGS

Figure 1:
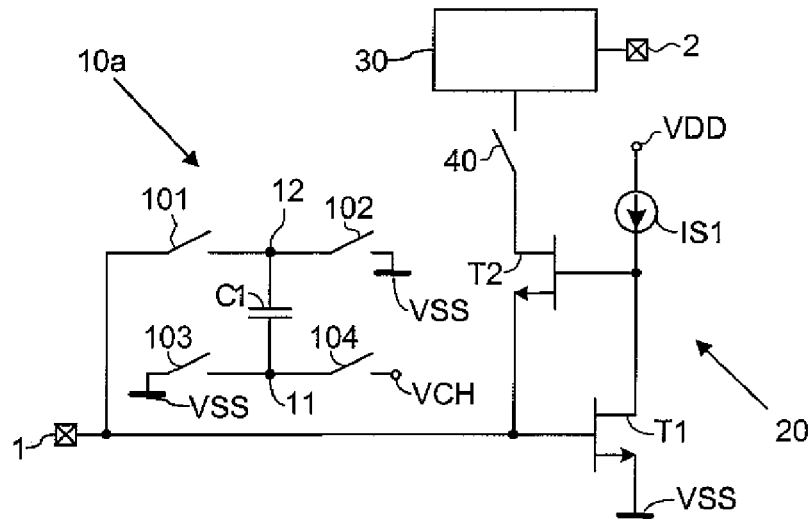
FIG. 1 shows a first embodiment of an arrangement for charge integration.

FIG. 1 illustrates an embodiment of an arrangement for charge integration that comprises a correction circuit 10A, a coupling circuit 20 and an integrator 30. The correction circuit 10A and the coupling circuit 20 are connected to an input 1, through which a charge-dependent signal can be supplied. The input to the integrator 30 is coupled through a switching unit 40 to the coupling circuit 20, while its output is coupled to an output 2 from which the results of an integration can be obtained. The coupling circuit 20 comprises a first and a second transistor T1, T2, which in this embodiment are implemented as n-channel field-effect transistors. A control or gate connection of the first transistor T1, and a source connection of the second transistor T2 are here coupled to the input 1. In addition, a control or gate connection of the second transistor T2, and a drain connection of the first transistor T1 are jointly coupled through a current source IS1 to a power supply connection VDD. A source connection of the first transistor T1 is connected to a source potential connection VSS. A drain connection of the second transistor T2 provides the output to the coupling circuit 20, and is coupled through the switching unit 40 to the integrator 30.

The correction circuit 10A comprises a capacitative charge store C1 and switches 101, 102, 103, 104 through which the charge store C1 can be connected to connections at different potentials. The charge store C1 may, for instance, be implemented as a capacitor. It can also be said that the correction circuit 10A is implemented as a switched capacitor circuit. For instance, a first connection 11 of the charge store C1 can be coupled through switch 104 to the charge potential connection VCH. Alternatively, connection 11 can be coupled through switch 103 to the source potential connection VSS. A second connection 12 can be coupled through switch 102 to the source potential connection VSS or through switch 101 to input 1.

The n-channel field-effect transistors T1, T2 cause that the charge integration arrangement is fundamentally appropriate for integrating negative charges, that is to say for the integration of a current passing from integrator 30 to a charge-generating sensor connected to input 1. When, during operation of the arrangement, a current flows to input 1, the potential at the gate connection to transistor T1 drops from what would otherwise be a higher value at which transistor T1 is kept in a conducting state, to a lower value at which transistor T1 is in a high-impedance state. As a result, the potential at the drain connection to transistor T1, or to the gate connection to transistor T2, rises, so that this is driven into a conductive state.

When switch 40, in response to a control signal, is closed, a current can flow from integrator 30 through the switch 40 and the transistor T2 to input 1, and be processed in integrator 30 to reach an integration result. As a result of the current flowing, a voltage can develop at the gate connection to the first transistor T1 that is approximately one threshold voltage $V_{THT1}$ higher than a voltage at the source potential connection VSS. This voltage can also be thought of as the equilibrium voltage VEQ1 of the coupling circuit 20. In other words, a voltage results at the gate connection to transistor T1 at which this begins to conduct, but at which current is still able to flow through transistor T2.

In order to also be able to integrate positive charges with the arrangement for charge integration, an additional negative charge can be inserted at input 1 by the correction circuit 10A. The charge store C1 is therefore charged during a first time period to a voltage corresponding to the potential difference between a charging voltage at the charging potential connection VCH and a source potential at the source potential connection VSS by placing switches 102 and 104 in a closed state. In a second time period, the switches 102, 104 are opened and the switches 101, 103 are closed. As a result the stored voltage, or the corresponding stored charge in the charge store C1, can be applied to input 1 during an integration process in the second time period. The charge store C1 is discharged here in such a way that the equilibrium voltage VEQ1 for the coupling circuit 20, as discussed above, results at connection 12.

Accordingly, a charge is supplied to input 1, and therefore to the integrator 30, corresponding to the product of the capacitance of the charge store C1 with the potential difference between the equilibrium voltage VEQ1 and the charging voltage. This quantity of charge, which is integrated by integrator 30 in addition to a charge supplied to input 1 by a sensor, can be subtracted during subsequent processing of the integration result. As a result of the additional negative charge from the charge store C1, positive charges supplied to input 1 of the arrangement during an integration procedure can also be processed.

The charging voltage at the charging potential connection VCH can adopt any known, constant value, usually located between the voltage at the source potential connection VSS and the voltage at the power supply potential connection VDD.

As discussed above, the quantity of charge supplied by the charge store depends on the DC voltage of the coupling circuit 20, which in turn is a function of the threshold voltage $V_{THT1}$ of the first transistor T1. Because, however, the threshold voltage $V_{THT1}$ is a temperature-dependent magnitude, changes in temperature arising, for instance, from the heating up of components, can have a temperature-dependent effect on the quantity of charge supplied by charge store C1. Variations of this kind can not, however, easily be taken into account in subsequent processing of the integration result, and precision is therefore impaired.

Figure 2:
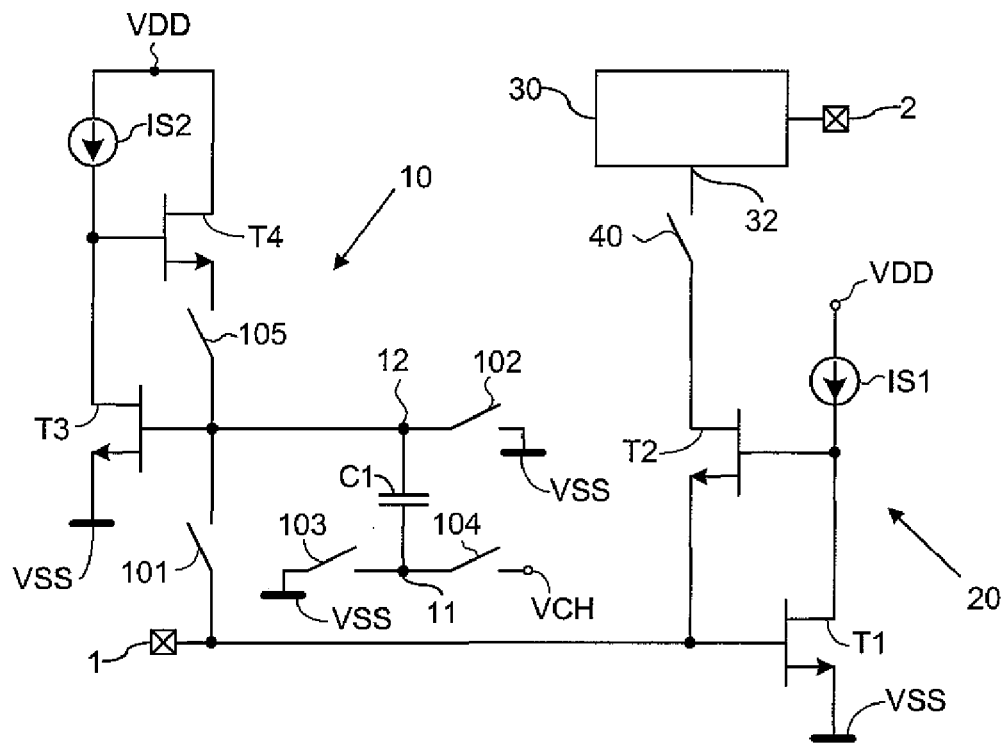
FIG. 2 shows a second embodiment of an arrangement for charge integration.

FIG. 2 shows a further embodiment of an arrangement for charge integration, in which an alternative correction circuit 10 is provided. Similarly to the correction circuit 10A from FIG. 1, the correction circuit 10 comprises a capacitive charge store C1, with switches 101, 102, 103, 104. The correction circuit 10 in this embodiment also comprises a third and a fourth transistor T3, T4, which are implemented, like transistors T1, T2 as n-channel field-effect transistors. A second current source, IS2, is also provided.

The circuit configuration of transistors T3 and T4 is similar to that of transistors T1 and T2. The gate or control connection of the third transistor T3 is coupled via a switch 105 to the source connection of the fourth transistor T4. The control or gate connection of the fourth transistor T4 is, together with the drain connection of the third transistor T3, coupled via the current source IS2 to the supply potential connection VDD. The drain connection of the fourth transistor T4 is also connected to the supply potential connection VDD. The transistor T3 favourably has the same temperature characteristics as the transistor T1. In particular, it is favourable if the threshold voltages $V_{THT1}$, $V_{THT3}$ of transistors T1, T3 are equal to one another. Equally, transistors T2, T4 have, in different implementations, the same temperature characteristic. Because the current sources IS1, IS2 may also demonstrate temperature-dependent behaviour, it is desirable for their temperature characteristics to also correspond to one another.

In operation of the arrangement, during integration, an equilibrium potential VEQ1 can again develop at the gate connection of transistor T1, corresponding to the potential difference between the threshold voltage $V_{THT1}$ and the voltage at the source potential connection VSS. In the correction circuit 10, a charge can be given to the charge store C1 via switches 102 to 105, and this can be passed through switch 101 to the input 1.

Figure 3:
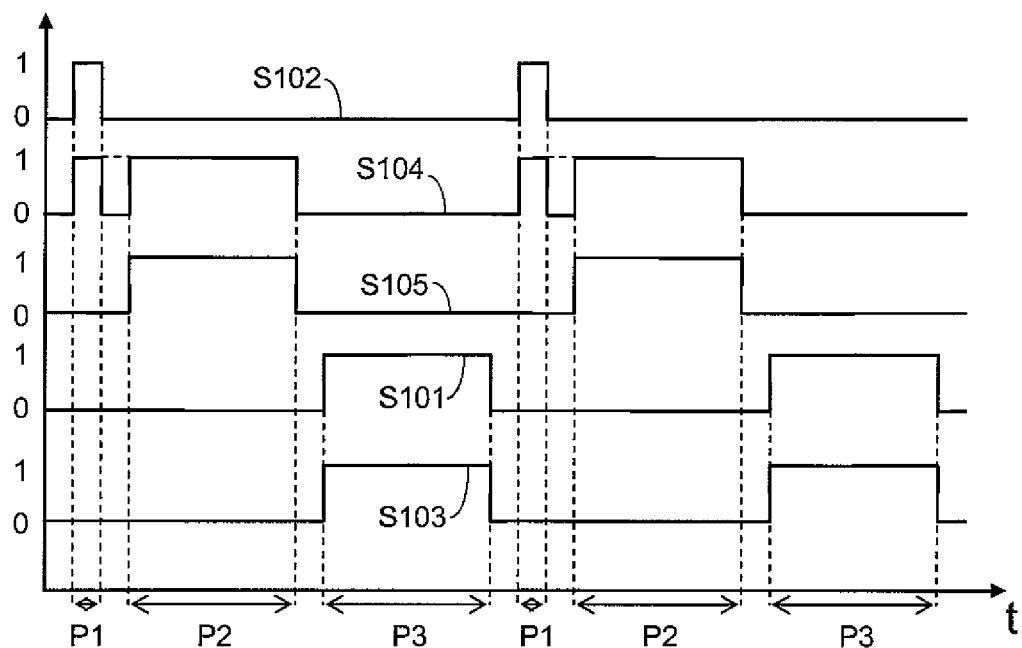
FIG. 3 shows a signal/time graph for control signals in an embodiment of a correction unit.

FIG. 3 illustrates a graph of a signal against time for control signals for the switches 101 to 105, by which the correction circuit 10 is taken through its operating cycle. A zero level on control signals S101 to 5105 represents an open switch, while a level of one corresponds to a closed switch. During a first time period P1, which can be referred to as the reset phase, switches 102, 104 are closed as a result of control signals S102, S104. In consequence, the charge store C1 is charged up to a voltage between connection 11 and connection 12, corresponding to the voltage difference between the charging voltage and the reference potential.

During a second time period P2, switches 104, 105 are closed in response to control signals S104, 5105, while the other switches 101, 102 and 103 are opened. The second time period, P2, which can also be called the charging phase, may follow the first time period P1 immediately. A pause may, however, be inserted between the first and second time periods P1, P2, so that the switching processes taking place in each of the switches which may, for instance, be implemented as transistor switches, have reliably completed. The switch 104 can here remain closed between the first and second phases P1, P2, or may briefly be opened.

As a result of the voltages in the charge store C1, that is as a result of its state of charge, a potential is present at the gate connection of transistor T3 immediately after switch 105 is closed, and this causes transistor T3 to be in a high-impedance state. Accordingly, the drain connection of transistor T3, which is also the gate connection to transistor T4, has a potential that places transistor T4 in a conducting state. The coupling created in this way to the supply potential connection VDD thereby changes the potential at node 12 in such a way that, similarly to the coupling circuit 20, an equilibrium voltage VEQ2 results, resulting from the potential difference between the threshold voltage $V_{THT3}$ of transistor T3 and the reference potential.

In this way, the third transistor T3 is controlled, depending on the state of charge of the charge store, in such a way that it creates a control signal for transistor T4. Depending on this control by the third transistor T3, the state of charge of the charge store C1 is affected in such a way that it is charged up to a voltage that corresponds to the potential difference between the charging voltage and the equilibrium potential VEQ2 of the correction circuit 10.

In a third time period P3 the switches 102, 104 and 105 are in an open state, while switches 101, 103 are held closed by the control signals S101 and S103. This third time period P3 can also be referred to as the injection or transfer phase. In the third time period P3, the charge accumulated in the charge store C1 is passed out to the input 1 or for integration at the integrator 30. Here, similarly to the mechanism described for the embodiment in FIG. 1, connection 12 of the charge store C1 is charged to the equilibrium voltage of the coupling circuit 20. In other words, the correction circuit 10 generates a further charge-dependent signal.

In this way a charge can be transferred to the integrator 30 corresponding to the product of the capacitance of the charge store C1 with the potential difference between the voltage across the charge store C1 and the equilibrium voltage VEQ1 of the coupling circuit 20. Because the voltage across the charge store C1 depends on the equilibrium voltage VEQ of the correction circuit 10, the equilibrium voltage VEQ2 of the correction circuit 10 and the equilibrium voltage VEQ1 of coupling circuit 10 cancel each other out in the calculation of the quantity of charge transferred if, due to having the same temperature characteristics, they are of the same magnitude. As a result, the transferred quantity of charge has a value that is independent of temperature, corresponding to the product of the capacitance of the charge store C1 with the charging voltage at the charging potential connection VCH, where the value represents a negative quantity of charge in this embodiment.

Transistors T3 and T4 can be scaled versions of transistors T1 and T2. The intended meaning of "scaled" here is that the capability of the first transistor T1 to drive a current at a voltage is equal to the capability of the third transistor T3 to drive a current at the voltage multiplied by a factor x. Also, the capability of the second transistor T2 to drive a current at a voltage is equal to the capability of the fourth transistor T4 to drive a current at the voltage multiplied by the same factor x. The factor x is a scaling factor. Thus, in an embodiment of the invention, a first width-to-length ratio of the first transistor T1 is equal to a third width-to-length ratio of the third transistor T3 multiplied by the factor x. Moreover, a second width-to-length ratio of the second transistor T2 is equal to a fourth width-to-length ratio of the fourth transistor T4 multiplied by the same factor x. Since the transistors T3, T4 preferably operate at lower currents in comparison to the transistors T1, T2, the factor x is larger than 1. In the same way, the second current source IS2 can be a scaled version of the first current source IS1. The intended meaning of "scaled" here is that the capability of the first current source IS1 to drive a current is equal to the capability of the second current source IS2 to drive a current multiplied by a factor y. The scaling factor y is preferably equal to the scaling factor x. The temperature characteristics of each of the elements in the correction circuit 10 will nevertheless correspond to the corresponding elements in the coupling circuit 20. In other words, the correction circuit can exhibit a temperature characteristic that is derived from the temperature-dependent coupling characteristic of the coupling circuit 20.

Due to the low current consumption of the correction circuit 10, the arrangement for integration is also suitable for applications where importance is placed on achieving low current consumption at the same time as low noise.

Transient processes in the correction circuit 10 depend on the capacitance of the charge store C1 and on the resistance values of the associated switches when they are closed. In order for transients to settle as fast as possible, switches may, for instance, be selected featuring a low value of resistance when conducting. The length of the time periods P1, P2, P3 is thus usually selected in such a way that transient processes have fully settled, in other words that charging processes have been completed. The quantity of charge transferred is thus independent of temperature. In addition, the arrangement for charge integration can also be applied to high-speed applications.

Because the charging voltage corresponds to a voltage between the power supply potential and the source potential, it is not necessary to supply external voltages outside this range to the arrangement. Components in the arrangement can accordingly be constructed favourably in CMOS technology.

In a further embodiment, a specified quantity of charge is stored, for instance in the charge store C1, depending on the charging voltage at the charging voltage connection VCH. A first control signal is generated through transistor T3, depending on the quantity of charge stored, and used to control transistor T4. In this way the stored quantity of charge is modified by transistor T4 according to the first control signal. The charge store is coupled to input 1, so generating a first charge-dependent signal as a function of the modified quantity of charge. A second charge-dependent signal from, for instance, a charge-generating sensor, is added through input 1 and combined with the first charge-dependent signal. A second control signal is generated by transistor T1, depending on the combined signal, and used to control the second transistor T2. The transistor T2, for instance, transmits the combined signal onwards depending on the control signal, so that it can be integrated in integrator 30 to create an output signal.

Because transistors T1, T3 can have a temperature-dependent characteristic, the first and second control signals may, for instance, be generated in a temperature-dependent manner.

Referring to FIG. 3, time period P3 may be followed by a further first time period P1, a further second time period P2 and a further third time period P3. In other words, a reset phase, a charging phase and an injection phase can be provided for every integration procedure in order to provide the specified, temperature-independent charge quantity for the integration procedure.

The integration can, for instance, be performed in integrator 30 by means of a switched capacitive charge store. Alternatively, integration can be done with the aid of a differential amplifier or operational amplifier with capacitive feedback.

Figure 4:
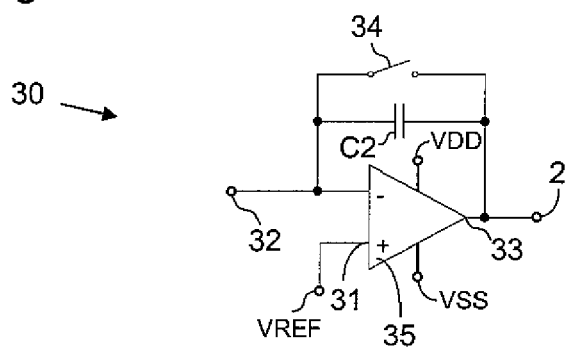
FIG. 4 shows an embodiment of an integrator and FIG. 5 shows an embodiment of a transistor current source.

FIG. 4 shows an embodiment of an integrator 30 that could, for instance, be used in the embodiments according to FIG. 1 or FIG. 2. The integrator 30 comprises a differential amplifier 35 with a first, non-inverting input 31 that is coupled to a reference voltage connection VREF. A second, inverting input 32 for the differential amplifier 35 provides an input to the integrator 30. An output 33 of the differential amplifier 35 is coupled through a second capacitative charge store C2 and a switch 34, connected in parallel with it, to the second input 32. The output 33 of the differential amplifier is also coupled to the output 2 for output of the integrated result.

The differential amplifier 35 is powered, for instance, through the power supply voltage connection VDD and the source potential connection VSS. Switch 34 can be closed to reset the charge store C2, in order to reach a defined initial condition for an integration. During the integration procedure itself, switch 34 is open and, referring to FIG. 2, switching unit 40 is closed, in order to permit the charge store C2 to become charged. When discharging the charge store C2 through the switch 34, the switch device 40 is normally open, so that the discharge can be carried out independently of the rest of the circuit.

The capacitative charge store C2 is, for instance, implemented in the form of a capacitor. A voltage at the reference potential connection VREF can, for instance, be provided by a ground potential.

Figure 5:
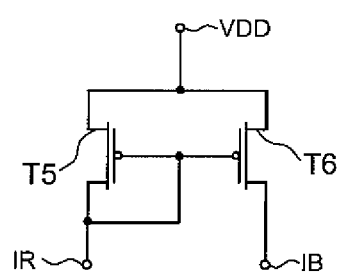

FIG. 5 illustrates an embodiment of a transistor current source which, in this form, can be used both for the first and for the second current source IS1, IS2. The current source comprises a pair of transistors T5, T6, connected as a current mirror. Transistors T5 and T6 are, in this embodiment, implemented as p-channel field-effect transistors. A reference current can be supplied through the reference connection IR resulting in a corresponding output current at the current output IB that depends on the ratio of the sizes of transistors T5 and T6.

Either insulated gate field-effect transistors or junction field-effect transistors can be used as the transistors shown in the embodiments. It is also, however, possible to use bipolar transistors. In other forms of embodiment of the arrangement for charge integration, moreover, the n-channel field-effect transistors can be replaced by complementary p-channel field-effect transistors. An arrangement for charge integration using, for instance, p-channel field-effect transistors is fundamentally suitable for integrating positive charges. Appropriately reversed current directions then apply.

An arrangement for charge integration according to one of the suggested embodiments can, for instance, be used in a digital X-ray machine. The charge carriers, or the charge-dependent signal at input 1 would here, for example, be supplied by photodiodes that release charge carriers in response to illumination. An arrangement can be manufactured in integrated form on a piece of semiconductor material.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An arrangement for charge integration, comprising:
an input to be supplied with a charge-dependent signal;
an integrator configured to integrate a signal presented to an input of the integrator;
a coupling circuit comprising first and second transistors, the first transistor being controlled depending on the charge-dependent signal, and the second transistor being configured to forward the charge-dependent signal depending on a control signal generated by the first transistor, said coupling circuit adopting at least two operating states to couple the input to the integrator and having a temperature-dependent coupling characteristic; and
a correction circuit coupled to the integrator for providing clocked operation, the correction circuit comprising a charge store which is switchably coupled to the input and is configured to be charged to a state that depends on a specified charging voltage, a third transistor configured to be controlled depending on the state of charge of the charge store, and a fourth transistor configured to affect the state of charge of the charge store depending on a control signal generated by the third transistor;
wherein the first and third transistors have temperature characteristics that correspond to one another; and
wherein the correction circuit is coupled to the input to transfer a quantity of charge from the charge store to the input and has a temperature characteristic that is derived from the temperature-dependent coupling characteristic of the coupling circuit.

2. The arrangement according to claim 1, wherein the transistors are field-effect transistors.

3. The arrangement according to claim 1, wherein both the correction circuit and the coupling circuit comprise current sources with corresponding temperature characteristics.

4. The arrangement according to claim 1, wherein the integrator comprises a differential amplifier having feedback through a further charge store.

5. The arrangement in accordance with claim 1, wherein the integrator is coupled to the coupling circuit through a switching unit that is adapted to be switched depending on a control signal.

6. A method of charge integration, comprising the steps of:
storing, in a charge store of a correction circuit coupled to an input to receive a second-charge dependent signal, a predetermined quantity of charge from a predetermined voltage;
generating, inside the correction circuit, a first control signal depending on the stored predetermined quantity of charge;
modifying, at the correction circuit, the stored predetermined quantity of charge responsive to a voltage level of the first control signal;
generating, at the correction circuit, a first charge-dependent signal responsive to the modified stored predetermined quantity of charge;
combining, at a coupling circuit, the first charge-dependent signal with the second charge-dependent signal;
generating, in the coupling circuit, a second control signal responsive to the combined signal;
forwarding the combined signal responsive to the second control signal from the coupling circuit to an integrator; and
integrating, by the integrator, the forwarded combined signal to create an output signal.

7. The method according to claim 6, wherein the generation of the first and second control signals is temperature-dependent.

8. The method according to claim 6, wherein integration is performed using a differential amplifier having feedback through a capacitative charge store.

* * * * *